United States Patent
Yeh et al.

(10) Patent No.: US 10,516,061 B2
(45) Date of Patent: Dec. 24, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Ling-Yen Yeh, Hsinchu (TW); Chih-Sheng Chang, Hsinchu (TW); Wilman Tsai, Saratoga, CA (US); Yu-Ming Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/907,008

(22) Filed: Feb. 27, 2018

(65) Prior Publication Data
US 2018/0190833 A1    Jul. 5, 2018

Related U.S. Application Data

(62) Division of application No. 15/401,463, filed on Jan. 9, 2017, now Pat. No. 10,056,498.
(Continued)

(51) Int. Cl.
*H01L 29/06* (2006.01)
*H01L 29/786* (2006.01)
(Continued)

(52) U.S. Cl.
CPC .... *H01L 29/78696* (2013.01); *H01L 21/0228* (2013.01); *H01L 21/02527* (2013.01);
(Continued)

(58) Field of Classification Search
CPC .......... H01L 29/78696; H01L 29/0653; H01L 29/1606; H01L 29/2003; H01L 29/24; H01L 29/401; H01L 29/66045; H01L 29/66522; H01L 29/66969; H01L 27/04; H01L 21/0228; H01L 21/02527;
(Continued)

(56) References Cited

U.S. PATENT DOCUMENTS 8,058,167 B2 * 11/2011 Snyder ................ H01L 29/0653
257/E21.159
9,368,591 B2    6/2016 Bentley et al.
(Continued)

OTHER PUBLICATIONS

Notice of Allowance issued in related parent U.S. Appl. No. 15/401,463, dated Apr. 13, 2018.
(Continued)

*Primary Examiner* — Tu-Tu V Ho
(74) *Attorney, Agent, or Firm* — McDermott Will & Emery LLP (57) ABSTRACT

A semiconductor device including a field effect transistor (FET) device includes a substrate and a channel structure formed of a two-dimensional (2D) material. An interfacial layer is formed on the channel structure. A gate stack including a gate electrode layer and a gate dielectric layer is formed over the interfacial layer. Source and drain contacts are formed over openings in the interfacial layer. The source and drain contacts have a side contact with the interfacial layer and a side contact and a surface contact with the channel structure.

20 Claims, 6 Drawing Sheets

Related U.S. Application Data (60) Provisional application No. 62/427,655, filed on Nov. 29, 2016.

(51) Int. Cl.
    *H01L 21/02*     (2006.01)
    *H01L 21/311*     (2006.01)
    *H01L 29/16*     (2006.01)
    *H01L 29/20*     (2006.01)
    *H01L 29/24*     (2006.01)
    *H01L 29/40*     (2006.01)
    *H01L 29/66*     (2006.01)

(52) U.S. Cl.
CPC .. *H01L 21/02565* (2013.01); *H01L 21/02568* (2013.01); *H01L 21/31116* (2013.01); *H01L 29/0653* (2013.01); *H01L 29/1606* (2013.01); *H01L 29/2003* (2013.01); *H01L 29/24* (2013.01); *H01L 29/401* (2013.01); *H01L 29/66045* (2013.01); *H01L 29/66522* (2013.01); *H01L 29/66969* (2013.01)

(58) Field of Classification Search
CPC ......... H01L 21/02565; H01L 21/02568; H01L 21/31116
USPC .......................................................... 257/29
See application file for complete search history.

(56) References Cited

U.S. PATENT DOCUMENTS

| | | | |
|---|---|---|---|
| 2010/0015802 A1* | 1/2010 | Snyder | H01L 29/0653 438/664 |
| 2016/0020335 A1* | 1/2016 | Bentley | H01L 29/45 257/256 |
| 2018/0012962 A1* | 1/2018 | Yeh | H01L 27/0886 |

OTHER PUBLICATIONS

D. Metzler et al., "Fluorocarbon assisted atomic layer etching of SiO2 using cyclic Ar/C4F8 plasma", Journal of Vacuum Science & Technology A, vol. 32, No. 2, (2014), pp. 1-4.

M. Frank et al., "Nucleation and interface formation mechanisms in atomic layer deposition of gate oxides", Applied Physics Letters, vol. 82, No. 26, Jun. 30, 2003, pp. 4758-4760.

https://link.springer.com/chapter/10.1007%2F10551045_16.

Z. Tang et al., "Progress of High-k Dielectrics Applicable to SONOS-Type Nonvolatile Semiconductor Memories", Transactions on Electrical and Electronic Materials, vol. 11, No. 4, Aug. 25, 2010, pp. 155-165.

P.B. Mirkarimi et al., "Review of advances in cubic boron nitride film synthesis", Materials Science and Engineering, Reports, R21, (1997), pp. 47-100.

Han Liu et al., "Phosphorene: An Unexplored 2D Semiconductor with a High Hole Mobility", American Chemical Society, NANO, Article, vol. 8, No. 4, (2014), pp. 4033-4041.

L. K. Tan et al., "Atomic layer deposition of a MoS2 film", The Royal Society of Chemistry, Nanoscale Paper, (2014), No. 6, pp. 10584-10588.

C. Jin et al., "Fabrication of a Freestanding Boron Nitride Single Layer and Its Defect Assignments", The American Physical Society, Physical Review Letters, No. 102, (2009), pp. 195505-1-195505-4.

J.D. Ferguson et al., "Atomic layer deposition of boron nitride using sequential exposures of BCl3 and NH3", Elsevier, Thin Solid Films, No. 413, (2002), pp. 16-25.

C. Jin et al., "Elemental discrimination of lattice defects in a boron nitride single layer", Auxiliary Materials Information.

Notice of Allowance issue in corresponding parent U.S. Appl. No. 15/401,463, dated Nov. 29, 2017.

\* cited by examiner

SEMICONDUCTOR DEVICE AND MANUFACTURING METHOD THEREOF

CROSS-REFERENCE TO RELATED APPLICATIONS

This application is a divisional of U.S. patent application Ser. No. 15/401,463, filed on Jan. 9, 2017, which claims the benefit of priority under 35 U.S.C. § 119 from U.S. Provisional Patent Application 62/427,655 filed Nov. 29, 2016, which is incorporated herein by reference in their entirety.

TECHNICAL FIELD

The disclosure relates to a semiconductor integrated circuit, and more particularly to atomic layer fabrication of two-dimensional (2D) devices.

BACKGROUND

With the progress of transistor process technology, the dimension of transistors has shrunk and therefore the number of transistors per unit area of an integrated circuit has increased accordingly. However, the off-state current has dramatically increased with further reduction in the channel length of a transistor, i.e., short channel effect. This effect is the major challenge of further increasing the density of transistors for transistors' channel length less than 20 nm. Reducing the thickness of channel is known as one way of suppressing short channel effect. Ultra-thin body transistors may employ ultra-thin semiconductor channel materials to suppress the short channel effect. 2D semiconductors are expected to be the channel material in ultra-thin body transistors. Two dimensional materials, such as transition metal dichalcogenides, graphene, and black phosphorus are regarded as promising candidates for transistor channels in FET devices. Conventional methods of fabrication of FET devices may be incapable of controlling the layer thickness and interface composition with atomic precision, which is of paramount importance in the fabrication of future generation of nano-electronic devices.

Solutions are required that can achieve a desired interface between gate dielectric layers and 2D channel materials with an ultra-thin body thickness, which can be less than about one-quarter of a respective gate width (e.g., 20 nm).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed, interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The device may be otherwise oriented (rotated 90 degrees or at other orientations), and the spatially relative descriptors used herein may likewise be interpreted accordingly. In addition, the term "made of" may mean either "comprising" or "consisting of."

Figure 1:
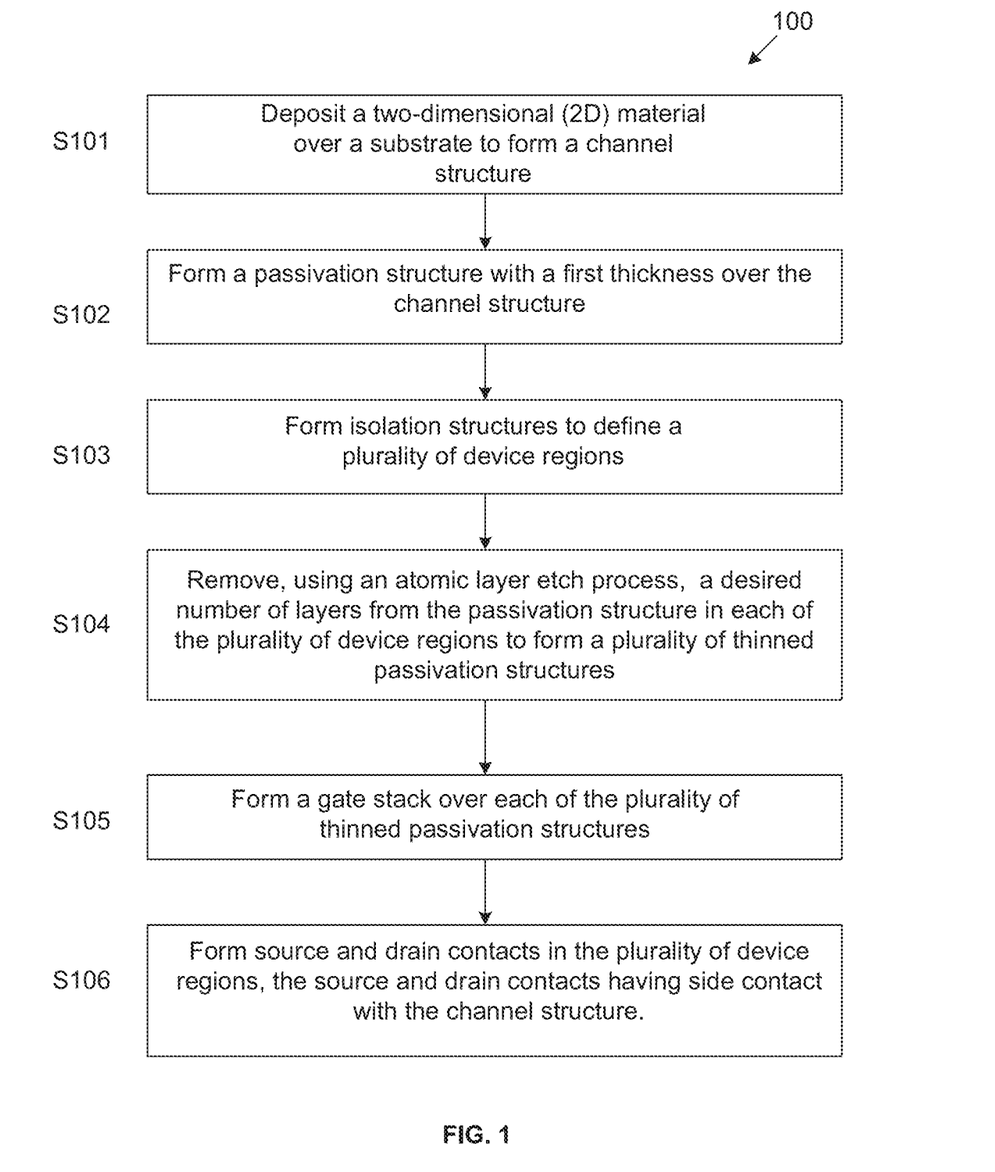
FIG. 1 is an exemplary process flow chart for atomic layer fabrication of a two-dimensional (2D) semiconductor device according to one or more embodiments of the present disclosure.

FIG. 1 is an exemplary process flow chart 100 for atomic layer fabrication of a two-dimensional (2D) semiconductor device such as a metal-oxide-semiconductor field-effect transistor (MOSFET), according to one or more embodiments of the present disclosure. The flow chart 100 illustrates only a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

Figure 2A:
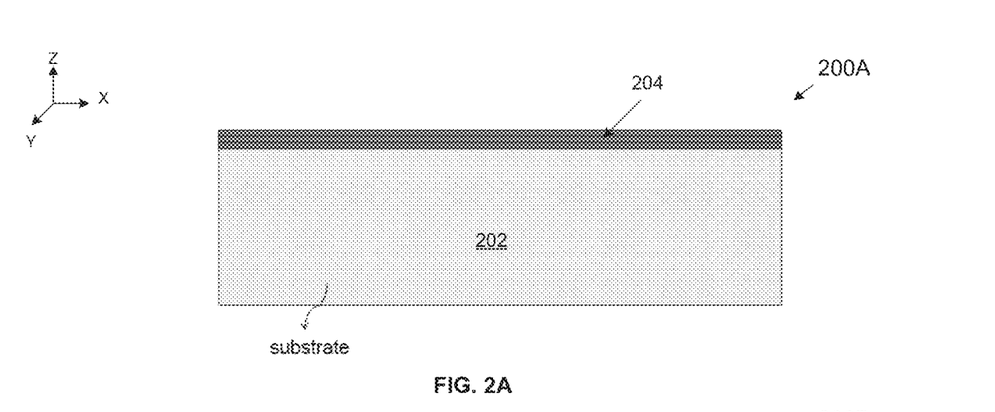
FIGS. 2A through 2H are exemplary two-dimensional views showing various processes for atomic layer fabrication of a 2D semiconductor device according to one or more embodiments of the present disclosure.

In S101 of FIG. 1, a two-dimensional (2D) material is formed over a substrate 202 to form a 2D material layer 204, as shown in an X-cut view 200A FIG. 2A. The substrate 202 can e, for example, a p-type silicon substrate with an impurity concentration in a range of about $1 \times 10^{15}$ cm$^{-3}$ to about $3 \times 10^{15}$ cm$^{-3}$ some embodiments. In other embodiments, the substrate is an n-type silicon substrate with an impurity concentration in a range of about $1 \times 10^{15}$ cm$^{-3}$ to about $3 \times 10^{15}$ cm$^{-3}$. The crystal orientation of Si substrate is (100) in some embodiments.

Alternatively, the substrate may comprise another elementary semiconductor, such as germanium, a compound semiconductor including Group IV-IV compound semiconductors such as silicon carbide (SiC) and silicon germanium (SiGe), and Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one or more embodiments, the substrate is a silicon layer of an SOI (silicon-on-insulator) substrate. Amorphous substrates, such as amorphous Si or amorphous SiC, or insulating material, such as silicon oxide, may also be used as the substrate. The substrate may include various regions that have been suitably doped with impurities (e.g., p-type or n-type conductivity).

In some embodiments, the 2D material layer 204, shown in the X-cut view 200A, is formed from a 2D material and is subsequently formed into a channel, an extension and S/D areas of a FET. The 2-D materials are usually few-layer thick and exist as stacks of strongly bonded layers with weak interlayer van der Waals attraction, allowing the layers to be mechanically or chemically exfoliated into individual, atomically thin layers. The 2-D materials are promising candidates of the channel materials of ultra-thin body transistors. Examples of 2D materials include graphene, graphyne, borophene, silicene, germanene, transition metal dichalcogendies (TMDs), black phosphorus and the like. In some aspects, the disclosed 2D channel can be a 2D semiconductor including a TMD, such as molybdenum disulfide ($MoS_2$), black phosphorous, or graphene. The 2D semiconductor may include one or more layers and can have a thickness within the range of about 0.5-100 nm in some embodiments. One advantageous feature of the few-layered 2D semiconductor is the high electron mobility ($\mu_e$) value, which is within a range of about 50-1000 $cm^2$/V-sec or even higher. It is understood that the bulk silicon, when cut to a low thickness (e.g., about 2 nm) comparable with a typical thickness of a 2D material film, can have its mobility degraded drastically.

It is understood that in many integrated circuits (ICs), the gate length of the widely used MOSFET devices are reduced or scaled down to increase the packing density of transistors in the IC and to increase the speed performance thereof. However, transistors with aggressively reduced gate lengths suffer from undesirable short-channel effects, such as increased off-state leakage current. One way to address suppressing of short-channel effects is to employ a semiconducting channel with reduced thickness, referred to as an ultra-thin body transistor. For example, to effectively suppress short-channel effects in transistors having gate lengths smaller than about 20 nm, one way is to employ a semiconducting channel with reduced thickness, e.g. less than 5 nm. A transistor having a semiconductor channel with a thickness less than one-third or sometimes one-quarter of its gate length is commonly referred to as an ultra-thin body transistor. Ultra-thin body transistors may employ ultra-thin channel materials.

2D materials, also referred to as single-layer or few-layer materials, are crystalline materials of a few layers of atoms that are promising candidates for use for thin channel materials. One type of 2D material with high mobility is black phosphorus (BP). BP is a layered material and a monolayer of BP is termed phosphorene. BP is a semiconductor with a direct band gap ranging from about 1.5 eV for a monolayer to about 0.59 eV for a five-layer stack at the Γ point of the first Brillouin zone.

In some embodiments, the 2D material layer 204 can be formed with a 2D material such as black phosphorus, using atomic layer deposition (ALD), as described herein. The description of the deposition method is exemplary only and is not intended to be limiting beyond what is specifically discussed. As one example, orthorhombic black phosphorus can be grown by a short-way transport reaction from red phosphorus and tin and/or tin-iodide as a mineralization additive. In another example, black phosphorus can be synthesized from white phosphorus under high pressure (e.g., about 13,000 $kg/cm^2$) at a temperature within a range of about 200-250 degrees Celsius. The thickness of the 2D material can be controlled by the deposition time. In an embodiment, the period of multiple layers (e.g., thickness of a monolayer) of phosphorene is about 0.53 nm. In some embodiments, the thickness may range from 1 monolayer to 20 monolayers (e.g., about 10.6 nm in thickness). As discussed below, the thickness in some embodiments may be varied between different regions (e.g., channel region and source/drain (S/D) region). In some embodiments, the thickness variation of an active region can be continuous. In other embodiments, the thickness is between approximately 1 monolayer and 10 monolayers (e.g., about 5.3 nm in thickness).

Figure 2B:
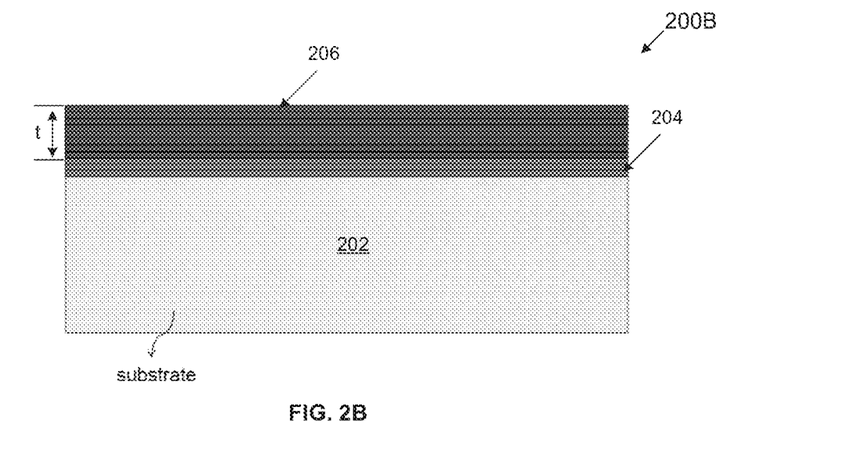

In S102 of FIG. 1, a passivation structure 206 with a first thickness t is formed over the channel structure 204, as shown in an X-cut view 200B FIG. 2B. The passivation structure 206 is an interfacial layer that can facilitate desired bonding of the gate dielectric material with the 2D channel material with an ultra-thin body thickness. Conventional methods generally are incapable to accomplish control of layer thickness and interface composition with atomic precision, which is crucial for future generation of nano-electronics devices. In addition, it is challenging to form high-quality gate dielectrics with small effective oxide thickness (EOT) on 2D materials. This is because of the lack of nucleation sites that is inherent to the 2D nature of this material. Therefore, most device fabrication either requires a rather thick oxide to avoid leakage, or inevitably induces dangling bonds to promote nucleation for oxide growth.

The passivation structure 206 of the current technology can resolve these issues and allow a desired dangling-bond free interface between the gate dielectric layer and the channel structure 204. In some embodiments, the passivation structure 206 can be deposited using the ALD or CVD processes. In some embodiments, the passivation structure 206 is a 2D insulator such as hexagonal boron nitride (h-BN, e.g., hexagonal BN). For example, when molybdenum disulfide ($MoS_2$) is used as the channel structure 204, the passivation structure can be boron nitride. Boron nitride is a wide band gap III-V compound with remarkable physical properties and chemical stability. Hexagonal BN (h-BN) includes alternating boron and nitrogen atoms in a honeycomb arrangement, including sp2-bonded two-dimensional (2D) layers. Each layer of hexagonal BN includes boron and nitrogen atoms that are bound by strong covalent bonds, whereas the layers are held together by weak van der Waals forces, as in graphite. Accordingly, h-BN films can be peeled off from bulk BN crystal by micromechanical cleavage and used as a dielectric layer. Few-layer hexagonal BN has also been made by ultrasonication and high-energy electron beam irradiation of BN particles.

Figure 2C:
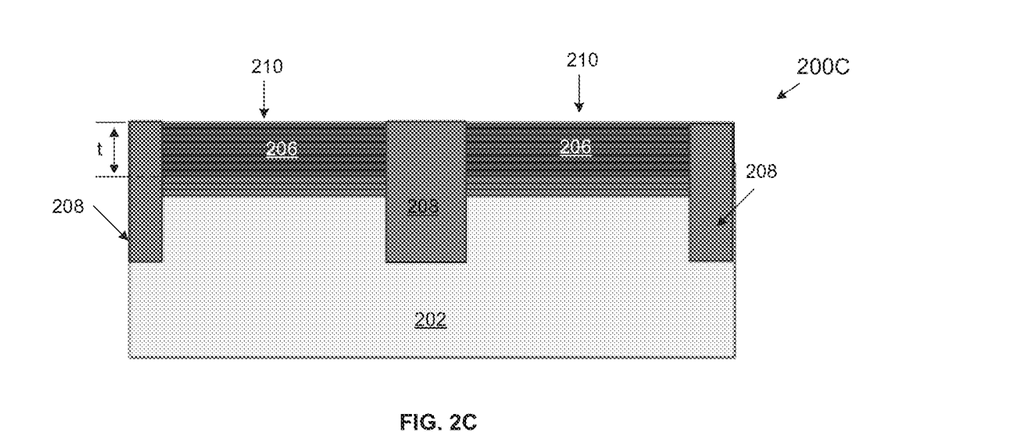

In S103 of FIG. 1, isolation structures 208 are formed to define a plurality of device regions 210, as shown in an X-cut view 200C FIG. 2C. The formation of isolation structures 208 is a known process. For example, the isolation structures 208 can be shallow trench isolation (STI) structures. The steps in creating isolation structures 208 include etching a pattern of trenches in the in process device (e.g., 200B of FIG. 2B), depositing one or more dielectric materials (such as silicon dioxide) to fill the trenches, and removing the excess dielectric using a technique such as chemical-mechanical planarization (CMP). The isolation structures 208 can include one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densities and shrinks. In some embodiments, multiple anneal processes are conducted. The flowable film is cured and annealed more than once. The flowable film may be doped with boron and/or phosphorous. The isolation structures 208 is formed by one or more layers of spin-on glass (SOG), SiO, SiON, SiOCN and/or fluorine-doped silicate glass (FSG) in some embodiments.

Figure 2D:
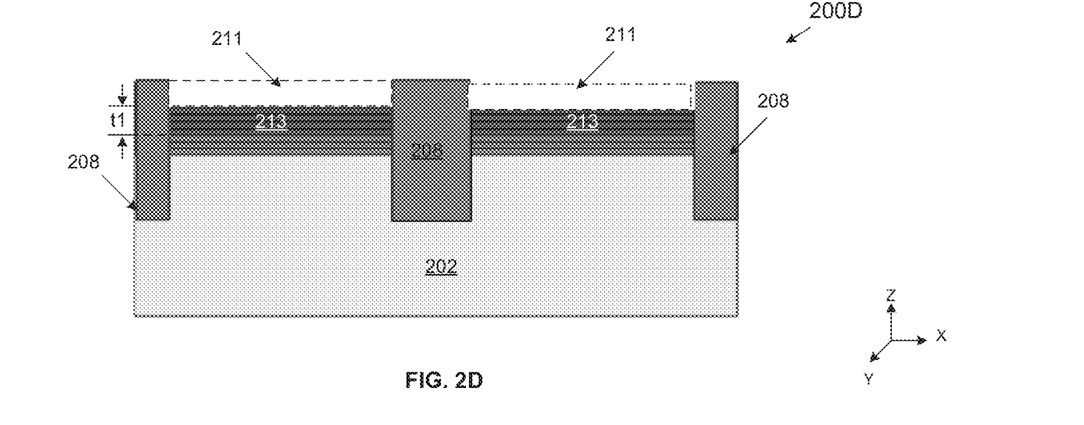

The step of removing the excess dielectric using the CMP technique leaves the top surfaces of the isolation structures 208 flush with the top surfaces of the passivation structures 206. The passivation structures, however, may be damaged by the isolation formation process. The damaged layers of the passivation structures 206 can be cleaned by using an atomic layer etch (ALE) technique. For example, as depicted in an X-cut view 200D of FIG. 2D, portions 211 including damaged layers shown by broken lines, are removed to form the cleaned passivation structures 213 with a thickness t1.

Figures 2E, 2F:
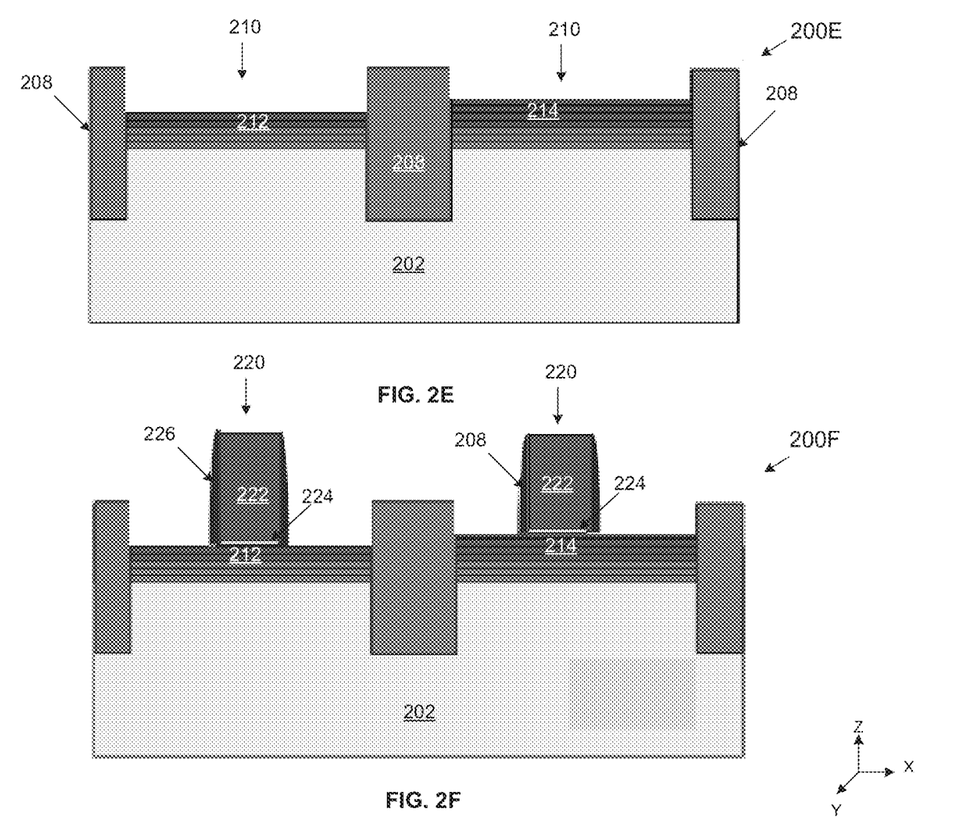

Returning to the flow chart 100 of FIG. 1, in S104, a desired number of layers from the passivation structure 206 in each of the device regions 210 are removed to form thinned passivation structures (e.g., 212 and 214), as shown in an X-cut view 200E FIG. 2E. The first thickness t already reduced to the thickness t1 to remove damaged layer has to be further reduced to achieve the desired thickness of passivation structure for each device. This step is performed because frequently the passivation layer (e.g., a 2D dielectric interlayer) on 2D channel has to be of ultra-thin thickness and the desired thickness can vary for different devices across a chip. The ALE method is useful since it serves to remove any undesirable residues, and help to pattern/etch the device structure to achieve high performance.

For example, the thickness t1 of the passivation structure 206 can be reduced by using the ALE process to make these structures thinner with atomic level precision. The removal leads to formation of thinned passivation structures to meet the specification of multi-gate oxide applications. For example, the passivation structures 212 and 214 can be applied for two different transistors (e.g., core or input/output (IO)) having different gate-oxide thicknesses (e.g., within a range of about 1-100 layers, each layer being about 0.5 nm). The passivation structures 212 and 214 are part of the gate oxide, as the gate high-k dielectric is formed on these passivation structures as will be explained herein.

In S105 of FIG. 1, a gate stack 220 is formed over each of the thinned passivation structures 212 and 214, as shown in an X-cut view 200F FIG. 2F. In one embodiment, the gate stack 220 is a known structure and includes a gate dielectric layer, a gate electrode layer 222, and spacer 226 and is formed over respective thinned passivation structures (e.g., 212 and 214). In some embodiments, gate dielectric layer includes a high-k dielectric material 224 and the passivation structures 212 and 214 (e.g., interfacial layers). The high-k dielectric material 224 can comprise metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the thickness of the gate dielectric layer is in the range of about −0.5 nm to about 10 nm. In another embodiment, the gate stack 220 includes a gate electrode layer 222, and spacers 226 and is formed over respective thinned passivation structures (e.g., 212 and 214). The passivation layer (212 and 214) under the gate electrode serve as the gate dielectrics in the embodiment, over which the high-k dielectric formed.

In some embodiments, the gate electrode layer 222 is a poly-silicon. The patterning of the poly-silicon layer is performed by using a hard mask including a silicon nitride layer and an oxide layer in some embodiments. In other embodiments, the gate electrode layer 222 includes a single layer or a multilayer structure. Further, the gate electrode layer 222 may be doped poly-silicon with uniform or non-uniform doping. In some alternative embodiments, the gate electrode layer 222 includes a metal such as Al, Cu, W, Ti, Ta, TiN, TiAl, TiAlN, TaN, NiSi, CoSi, and other conductive materials with a work function compatible with the substrate material, or combinations thereof. The electrode layer for the gate electrode layer 222 may be formed using a suitable process such as ALD, CVD, PVD, plating, or combinations thereof. The width of the gate electrode layer 222 (in the X direction) is in the range of about 30 nm to about 60 nm in some embodiments.

Figure 2G:
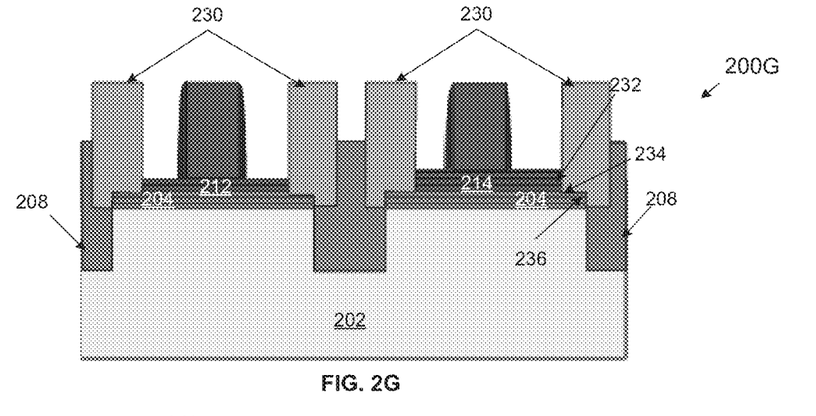

In S106 of FIG. 1, source and drain contacts 230 are formed in the device regions, as shown in an X-cut view 200G FIG. 2G. The formation of the source and drain contacts 230 is after patterning and etching of the isolation structure 208 and the thinned passivation structures 212 and 214 to allow the source and drain contacts 230 have side contacts (e.g., 232) with the thinned passivation structures 212 and 214 and side contacts (e.g., 234) and surface contact (e.g., 236) with the channel structure 204. This is an advantageous feature of the subject technology that provides more contact area in the source and drain contacts 230 of the transistor, which results in reduced contact resistance.

In one or more implementations, example metals that can be used for the source and drain contacts 230 include Al, Cu, W, Ti, Ta, TiN, TiAl, TiAlN, TaN, NiSi, CoSi, and other conductive materials with a suitable work function, or combinations thereof. In some implementations, the source and drain contacts 230 can be deposited using, for example, ALD, CVD, PVD, or other suitable deposition techniques. In some embodiments, an optional annealing process, for example, at a temperature within the range of about 250-350 degrees C. can be performed to improve the metal-to-source/drain contact resistance. The process concepts described above can be integrated into the present MOSFET fabrication process, and can be implemented in a number of technology nodes, such as 10, 7, and 5 nm technology nodes.

Figure 2H:
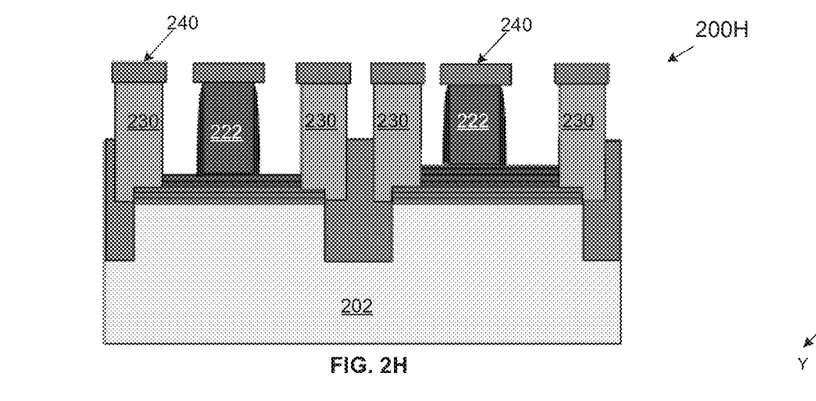

The next step, as shown in the X-cut view 200H of FIG. 2H, is forming metal layer 240 over the gate electrodes 222 and the source and drain contacts 230. Forming the metal layer 240 includes patterning and deposition the metal layer (e.g., aluminum, tungsten, and the like), for example, by one of the know deposition processes such as, CVD, ALD, PVD, or a combination thereof. The metal layer 240 serves as the interconnect between various devices on the chip.

Figure 3:
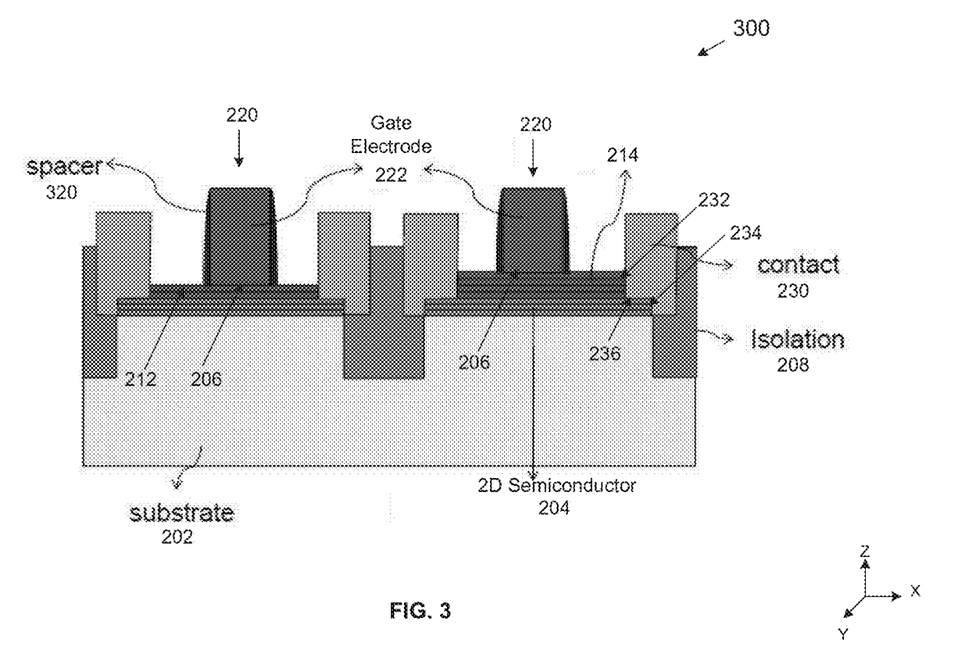
FIG. 3 is a diagram illustrating structural details of a 2D MOSFET device according to one or more embodiments of the present disclosure.

FIG. 3 is a diagram illustrating structural details of a semiconductor device 300 according to one or more embodiments of the present disclosure. An example of the semiconductor device 300 includes a FET device such as a MOSFET device. The semiconductor device 300 includes the substrate 202, the channel structure 204, the passivation layers 212 and 214, the gate stack 220, and source and drain contacts 230. The 2D material layer 204 is formed of a 2D material, as explained above. The actual channel of the transistor is a portion of the 2D material layer 204 that is under the gate stacks 220. The passivation layer 212 and 214 are as discussed above and are formed of a 2D dielectric material. The gate stack 220 includes a gate electrode layer 222, and gate dielectric layers 206 formed over the passivation layers 212 and 214 as interfacial layers. In some embodiments, the interfacial layers 206 are formed from the passivation layers 212 and 214 between the gate electrode 222 and the passivation layers 212 and 214. In some embodiments, the gate dielectric layers 206 may include the high-k dielectric. Source and drain contacts 230 are formed over openings in the interfacial layer 206 and the isolation regions 208.

In some implementations, the source and drain contacts 230 have a side contact 232 with the interfacial layer 206 and a side contact 234 and a surface contact 236 with the 2D material layer 204 as described above with respect to FIG. 2G. The surface contact 236 with the 2D material layer 204 extends in a first direction (X) perpendicular to the side contact 234. The 2D material layer 204 comprises a 2D semiconductor such as molybdenum disulfide ($MoS_2$), black phosphorous, and graphene. The interfacial layer includes a 2D insulator material such as and hexagonal boron nitride in one embodiment. The gate stack includes a high-k dielectric material and the gate electrode as discussed above.

It will be understood that not all advantages have been necessarily discussed herein, no particular advantage is required for all embodiments or examples, and other embodiments or examples may offer different advantages.

In accordance with one aspect of the present disclosure, a method for manufacturing a semiconductor device includes forming a 2D material over a substrate to form a channel structure. A passivation structure is formed with a first thickness over the channel structure. Isolation structures are formed to define a plurality of device regions. Using an atomic layer etch process a desired number of layers is removed from the passivation structure in each of the device regions to form a number of thinned passivation structures. A gate stack is formed over each of the thinned passivation structures, and source and drain contacts are formed in the device regions. The source and drain contacts have side contacts with the 2D semiconducting materials and 2D dielectrics in some implementations.

In some embodiments, the 2D material comprises a semiconducting 2D material including black phosphorous and the passivation structure comprises a 2D insulator material including boron nitride. The method can further include forming the channel structure and the passivation structure using an atomic layer deposition (ALD) process. In some embodiments, the first thickness can be within a range of about 100-200 layers. The 2D material comprises a semiconducting 2D material including molybdenum disulfide ($MoS_2$) and the passivation structure comprises a 2D insulator material including alumina ($Al_2O_3$). Portions of the isolation structures and the thinned passivation structures are removed to allow the source and drain contacts to have side contact with the channel structure and the thinned passivation structures. In some implementations, the 2D material comprises a 2D semiconductor such as a transition metal dichalcogenide (TMD) including molybdenum disulfide ($MoS_2$), black phosphorous, or graphene. The gate stack includes a high-k oxide formed over one of thinned passivation structures. In some embodiments, each of the thinned passivation structures has a different thickness within a range of about 1-100 layers of a 2D insulator material. The substrate includes one of silicon (Si), silicon dioxide ($SiO_2$), silicon covered with a dialectic material, or germanium (Ge).

In accordance with another aspect of the present disclosure, a method for manufacturing a semiconductor device includes forming a channel structure over a substrate. An interfacial structure is formed over the channel structure. Isolation regions penetrating the substrate are formed to define device regions. Damaged layers of the interfacial structure are removed. Using an ALE process desired number of layers from the interfacial structure in each of the device regions are removed to form isolated thinned interfacial structures. A gate stack is formed over each of the isolated thinned interfacial structures. Source and drain contacts are formed in the device regions by removing portions of the isolation regions and the isolated thinned interfacial structures to allow source and drain contacts having side contacts with the channel structure and isolated thinned interfacial structures.

In accordance with yet another aspect of the present disclosure, a semiconductor device includes a FET device such as a MOSFET. The FET device includes a substrate and a channel structure formed of a two-dimensional (2D) material. An interfacial layer is formed on the channel structure. A gate stack including a gate electrode layer and a gate dielectric layer is formed over the interfacial layer. Source and drain contacts are formed over openings in the interfacial layer. The source and drain contacts have a side contact with the interfacial layer and a side contact and a surface contact with the channel structure.

The foregoing outline features several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a field effect transistor (FET) device including:
      a substrate;
      a channel structure formed of a two-dimensional (2D) material;
      an interfacial layer formed on the channel structure;
      a gate stack including a gate electrode layer and a gate dielectric layer formed over the interfacial layer; and
      source and drain contacts formed over openings in the interfacial layer, wherein
         the interfacial layer continuously covers an entirety of the channel structure, the channel structure extending between the source and drain contacts,
         the source and drain contacts contact a side of the interfacial layer, and
         the source and drain contacts contact a side and an upper surface of the channel structure.

2. The semiconductor device of claim 1, wherein the upper surface of the channel structure extends in a first direction perpendicular to the side of the channel structure, and wherein the channel structure comprises a 2D semiconductor comprising a transition metal dichalcogenide (TMD) including molybdenum disulfide ($MoS_2$), black phosphorous, or graphene.

3. The semiconductor device of claim 1, wherein the interfacial layer comprises a 2D insulator material including at least one of alumina ($Al_2O_3$) and hexagonal boron nitride.

4. The semiconductor device of claim 1, wherein the 2D material has a thickness in a range from 1 monolayer to 20 monolayers.

5. The semiconductor device of claim 1, wherein the gate electrode layer has a gate length smaller than 20 nm.

6. The semiconductor device of claim 1, wherein the gate electrode layer has a gate width in a range from 30 to 60 nm.

7. The semiconductor device of claim 1, wherein the gate dielectric layer has a thickness in a range from 0.5 to 10 nm.

8. The semiconductor device of claim 1, wherein the gate dielectric layer includes a high-k dielectric material.

9. The semiconductor device of claim 8, wherein the high-k dielectric material comprises metal oxides including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and mixtures thereof.

10. The semiconductor device of claim 1, wherein the source and drain contacts are formed of at least one of Al, Cu, W, Ti, Ta, TiN, TiAl, TiAlN, TaN, NiSi, CoSi, and conductive materials with a suitable work function.

11. The semiconductor device of claim 1, further comprising a metal layer formed over the gate electrodes and the source and drain contacts.

12. The semiconductor device of claim 11, wherein the metal layer is formed of at least one of aluminum and tungsten.

13. A semiconductor device, comprising:
a field effect transistor (FET) device including:
a substrate;
a channel structure formed of a two-dimensional (2D) material;
isolation structures in the substrate to define a plurality of device regions;
isolated thinned interfacial structures formed on the channel structure;
a gate stack including a gate electrode layer and a gate dielectric layer formed over the isolated thinned interfacial structures; and
source and drain contacts formed over openings in the isolated thinned interfacial structures, wherein
the isolated thinned interfacial structures continuously cover an entirety of the channel structure, the channel structure extending between the source and drain contacts,
the source and drain contacts contact a side of the isolated thinned interfacial structures, and
the source and drain contacts contact a side and a upper surface of the channel structure.

14. The semiconductor device of claim 13, wherein the upper surface of the channel structure extends in a first direction perpendicular to the side of the channel structure, and wherein the channel structure comprises a 2D semiconductor comprising a transition metal dichalcogenide (TMD) including molybdenum disulfide ($MoS_2$), black phosphorous, or graphene.

15. The semiconductor device of claim 13, wherein the isolated thinned interfacial structures comprises a 2D insulator material including at least one of alumina ($Al_2O_3$) and hexagonal boron nitride.

16. The semiconductor device of claim 13, wherein the 2D material has a thickness in a range from 1 monolayer to 20 monolayers.

17. The semiconductor device of claim 13, wherein the gate electrode layer has a gate length smaller than 20 nm.

18. The semiconductor device of claim 13, further comprising a metal layer formed over the gate electrodes and the source and drain contacts.

19. A semiconductor device, comprising:
a field effect transistor (FET) device including:
a substrate;
a channel structure formed of a two-dimensional (2D) material;
isolation structures in the substrate to define a plurality of device regions;
thinned passivation structures formed over the channel structure;
a gate stack including a gate electrode layer and a gate dielectric layer formed over the thinned passivation structures; and
source and drain contacts formed over openings in the thinned passivation structures, wherein
the thinned passivation structures continuously cover an entirety of the channel structure, the channel structure extending between the source and drain contacts,
the source and drain contacts contact a side of the thinned passivation structures, and
the source and drain contacts contact a side and an upper surface of the channel structure.

20. The semiconductor device of claim 19, further comprising spacers formed over respective thinned passivation structures.

* * * * *